US005886935A

United States Patent [19]

Lakhani et al.

[11] Patent Number: 5,886,935

[45] Date of Patent: Mar. 23, 1999

[54] HIGH AND NEGATIVE VOLTAGE COMPARE

[75] Inventors: Vinod Lakhani, Milpitas; Christophe J. Chevallier, Palo Alto, both of Calif.

[73] Assignee: Micron Technology, Inc., Santa Clara, Calif.

[21] Appl. No.: 916,603

[22] Filed: Aug. 22, 1997

[51] Int. Cl.[6] .......... G11C 7/00

[52] U.S. Cl. .......... 365/201; 365/189.07; 365/191

[58] Field of Search .......... 365/189.02, 201, 365/185.22, 230.03, 191, 189.07

[56] References Cited

U.S. PATENT DOCUMENTS

| | | | |
|---|---|---|---|
| 5,528,173 | 6/1996 | Merritt et al. | 326/80 |
| 5,581,206 | 12/1996 | Chevallier et al. | 327/143 |
| 5,615,159 | 3/1997 | Roohparvar | 365/201 |
| 5,636,166 | 6/1997 | Roohparvar | 365/194 |
| 5,675,540 | 10/1997 | Roohparvar | 365/185.22 |
| 5,677,885 | 10/1997 | Roohparvar | 365/201 |

*Primary Examiner*—David Nelms
*Assistant Examiner*—Thong Le
*Attorney, Agent, or Firm*—Schwegman, Lundberg, Woessner & Kluth, P.A.

[57] ABSTRACT

A voltage of a relatively large potential internal signal in an integrated circuit is tested by providing a comparison signal having a voltage that is lower than the voltage of the relatively large potential internal signal. The voltage of the relatively large potential internal signal is scaled so that the voltage of the scaled internal signal is lower than the voltage of the relatively large potential internal signal. The voltages of the scaled internal signal and the comparison signal are compared. In another form of the invention, a voltage of a negative potential internal signal in an integrated circuit is tested by providing a comparison signal having a voltage higher than the ground potential. The voltage of the negative potential internal signal is converted to a voltage higher than the ground potential. The voltages of the converted internal signal and the comparison signal are compared.

37 Claims, 6 Drawing Sheets

HIGH AND NEGATIVE VOLTAGE COMPARE

FIELD OF THE INVENTION

The present invention generally relates to integrated circuits, and more particularly to testing internal voltages in integrated circuits, such as non-volatile memories.

BACKGROUND OF THE INVENTION

Modern integrated circuits (ICs), such as non-volatile memories, include thousands of components. Due to variations in semiconductor processing, not all of the components in the IC are fabricated to desired specifications. When components of the IC are not fabricated as desired, the IC may not operate properly.

It is therefore desirable to evaluate the components during or after IC fabrication. One method of testing a component of an IC is performed by extracting an internal signal in the IC, corresponding to the component, and externally comparing the potential, or voltage, of the internal signal with a comparison voltage. If the comparison demonstrates that the potential of the internal signal is excessively larger or smaller than the comparison voltage, the corresponding IC component is shown to be fabricated improperly.

The internal signals of memory ICs are typically extracted by applying a micro-probe to the IC component or routing the internal signal through a multiplexer to a common probe point. The micro-probing technique requires the use of complex computer micro-probe cards. Also, internal signals having negative or relatively large potentials, such as required in non-volatile memories, are extracted with difficulty with micro-probe cards. Relatively large potentials are potentials that exceed supply voltages provided to the non-volatile memory, such as the programming voltage required in non-volatile memories. These relatively large voltages are typically generated with internal voltage pumps.

The micro-probe cards cannot typically be employed to characterize internal signals of mounted or packaged IC memories. Thus, after an IC memory is packaged, the multiplexing technique is typically used to read out internal voltages, which requires complex multiplexing circuitry in the memory IC. The complicated multiplexing circuitry complicates the memory design and testing process, particularly for internal signals having negative potentials. In fact, in many cases even with modem pico-probes, negative voltages cannot be extracted from the memory IC. Therefore, there is a need for a technique to more effectively analyze internal signals of an IC, such as a non-volatile memory, particularly internal signals having negative or large potentials. Furthermore, there is a need for a technique to more effectively analyze internal signals of a mounted or packaged IC, such as a non-volatile memory.

SUMMARY OF THE INVENTION

The present invention provides a method and apparatus for testing a voltage of an internal signal in an integrated circuit (IC). In one form of the present invention, a comparison signal is provided that has a voltage that is lower than the voltage of the internal signal. The voltage of the internal signal is scaled so that the voltage of the scaled internal signal is lower than the voltage of the internal signal. The voltages of the scaled internal signal and the comparison signal are compared.

In another form of the present invention, the internal signal has a voltage lower than a ground potential. A comparison signal having a voltage higher than the ground potential is provided. The voltage of the internal signal is converted to a voltage higher than the ground potential. The voltages of the converted internal signal and the comparison signal are compared.

In one embodiment of the present invention, a binary digital signal is provided representing the results of the comparison of the voltages of the scaled internal signal and the comparison signal. In this embodiment, the voltage of the internal signal is adjusted so that the voltage of the internal signal is substantially equivalent to the voltage of the comparison signal based upon the state of the binary digital signal.

In one embodiment, the IC comprises a switch operatively coupled to internal signals and a selection signal. The comparator is coupled to the switch and a comparison signal. The switch selects and scales an internal signal corresponding to the selection signal. The comparator provides a binary digital indicating the relative potentials of the selected internal and comparison signals. In yet another embodiment, a memory IC comprises a memory array, an I/O circuit, a control logic circuit, an address logic circuit, and a switchable comparator. The switchable comparator is coupled to the memory array.

It is a feature of the present invention that the potentials of internal signals having negative or relatively large voltages can be compared to the voltage of a comparison signal. It is a further benefit of the present invention that the comparison signal can be provided from a source within the IC or externally to the IC. It is a further advantage of the present invention that internal signals of a packaged or mounted IC may be analyzed. It is also a further benefit of the present invention that the digital signal can be used to modify IC internal signals and/or components.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable persons skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined only by the appended claims.

The present invention relates to an apparatus and method for characterizing the internal signals of an integrated circuit (IC). The following described embodiments of the present invention are described as applied to a non-volatile memory, such as a flash memory. The present invention is not limited to non-volatile memories, as the present invention is equally applied to other memory devices. In fact, the present invention can be applied to any electronic integrated circuit where internal signals need to be characterized that have negative or relatively large voltages.

Figure 1:
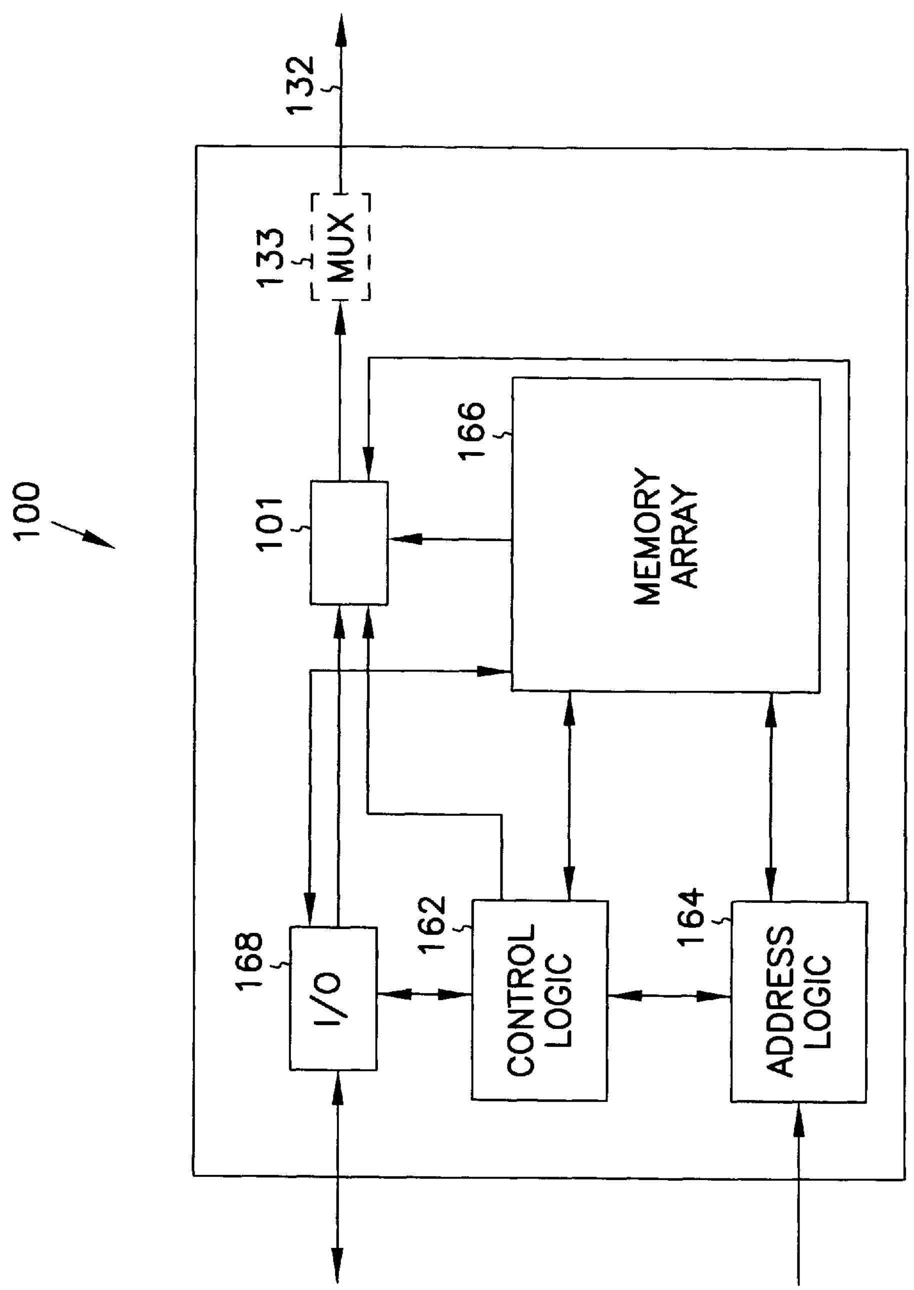
FIG. 1 is a block diagram of a non-volatile memory integrated circuit (IC) according to the present invention.

A non-volatile memory IC 100 according the present invention is illustrated generally at 100 in FIG. 1. Non-volatile memory 100 comprises a switchable comparator 101, a memory array 166, I/O circuitry 168, control logic 162, and address logic 164 coupled in the manner exemplified by FIG. 1.

Figure 2:
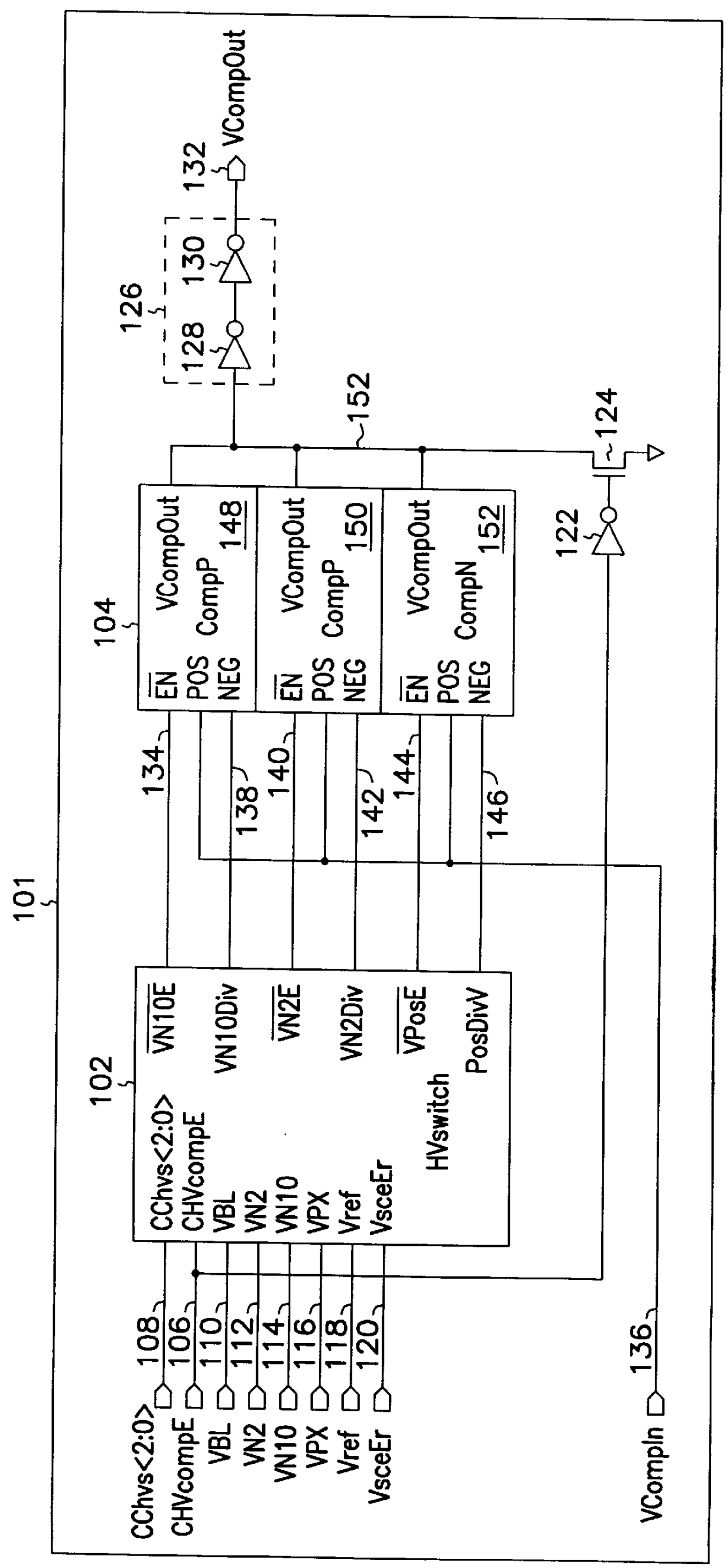
FIG. 2 is a schematic diagram of a switchable comparator employed in the non-volatile memory IC of FIG. 1.

Switchable comparator 101 is illustrated in block diagram form in FIG. 2. Switchable comparator 101 includes a high voltage switch 102 receiving certain internal signals and providing comparator enable signals and scaled internal signals to a comparator 104. Comparator 104 provides a CompOut signal on a line 152. An inverter 122 is coupled to the gate of an n-channel transistor 124. The source of n-channel transistor 124 is coupled to ground. The drain of n-channel transistor 124 is coupled to line 152. A buffer circuit 126 receives the CompOut signal on line 152 and provides a VcompOut signal 132, which is the output of the switchable comparator 101. The buffer circuit 126 comprises two serially coupled inverters 128 and 130.

Certain internal signals of non-volatile memory 100 are coupled to the high voltage switch 102. The internal signals have negative or relatively large potentials. Relatively large potentials are potentials that exceed supply voltages provided to non-volatile memory 100. These relatively large voltages are typically generated with internal voltage pumps. The internal signals comprise a bit line voltage (VBL) a 110, a negative supply voltage (VN10) 114, a secondary negative supply voltage (VN2) 112, a wordline voltage (VPX) 116, an internal reference voltage (Vref) 118, and a source supply voltage (VsceEr) 120. Additionally, an enable signal (CHVcompE) 106 and a selection signal (CChvs) 108 are coupled to the high voltage switch 102. The CChvs signal 108 comprises three bits, that indicate a selected internal signal to be evaluated.

In response to the internal signals, high voltage switch 102 generates comparator enable signals and scaled internal signals that are coupled to comparator 104. The comparator enable signals include VN10E 134, VN2E 140, and VPosE 144. The scaled internal signals include VN10DivV 138, VN2DivV 142, and PosDivV 146.

Switchable comparator 101 receives a comparison signal 136 (VcompIn), which is coupled to comparator 104. The VcompIn signal 136 has a potential higher than a ground potential of non-volatile memory 100. In one embodiment, the VcompIn signal 136 is externally supplied to non-volatile memory 100. For example, the Vcompln signal 136 can be applied directly to an IC pad of non-volatile memory 100. In an alternative embodiment, the VcompIn signal 136 is internally generated in non-volatile memory 100.

In the operation of switchable comparator 101, high voltage switch 102 responds to the CHVcompE signal 106 being activated to a high level to scale the internal signal selected by the CChvs signal 108. The scaled internal signal is provided to comparator 104, which compares the scaled internal signal to the Vcompin signal 136. The potential of the scaled internal signal is uniquely proportional to the potential of the internal signal selected by the CChvs signal 108. When the CHVcompE signal 106 is at a low level, inverter 122 provides a high level to the gate of n-channel transistor 124, which turns on n-channel transistor 124, which brings output line 152 to a ground level. When the CHVcompE signal is activated high, inverter 122 provides a low level to the gate of n-channel transistor 124 to shut off n-channel transistor 122 to permit comparator 104 to control the level of the CompOut signal on line 152.

The CompOut signal on line 152 from comparator 104 is a binary digital signal indicating whether the selected scaled internal signal has a potential greater than or equal to the potential of the Vcompin signal 136. The corresponding VcompOut signal 132 of switchable comparator 101 has a binary state of one under the following conditions:

| CChvs Select Signal 108 | Internal Signals | Conditions for VCompOut Signal 132 to Switch to Binary State = 1 |
|---|---|---|
| 000 | VPX 116 | VPX ≧ 5*VCompIn |
| 001 | VBL 110 | VBL ≧ 4*VCompIn |
| 010 | VsceEr 120 | VSceEr ≧ 5*VCompIn |
| 011 | Vref 118 | Vref ≧ VCompIn |
| 100 | VN2 1 12 | VN2 ≧ (6*VCompIn - 5*Vref) |
| 101 | VN10 114 | VN10 ≧ (7.76*VCompIn-6.67*Vref) |

In one embodiment, the binary digital VCompOut signal 132 is provided directly to a dedicated pin of memory IC 100. Optionally, as illustrated in FIG. 1, binary digital VCompOut signal 132 is provided to a multiplexer 133, which also receives at least one other internal signal of the memory IC 100. In this way, memory IC 100 does not need a dedicated pin to output the binary digital VCompOut signal 132. Instead, binary digital VCompOut signal 132 shares an already used pin of memory IC 100 with at least one other internal signal. Multiplexer 133 couples the binary digital signal to an output pin at a first time and couples at least one other internal signal to the output pin at a second time.

In one embodiment of the present invention, the voltage level of the selected internal signal is determined relative to the VCompin signal 136 based on the state of the VCompOut signal 132. In this way, the VCompOut signal 132 is used to determine if the selected internal signal is at a suitable voltage level. If the selected internal signal is not a suitable voltage level, the voltage level of the selected internal signal is adjusted or trimmed, and then re-tested to determine if the adjusted voltage level is suitable. In one embodiment, the potential of the internal signal is adjusted by modifying a non-volatile memory IC 100 component, such as by laser trimming or by manipulating fuses.

Figure 3:
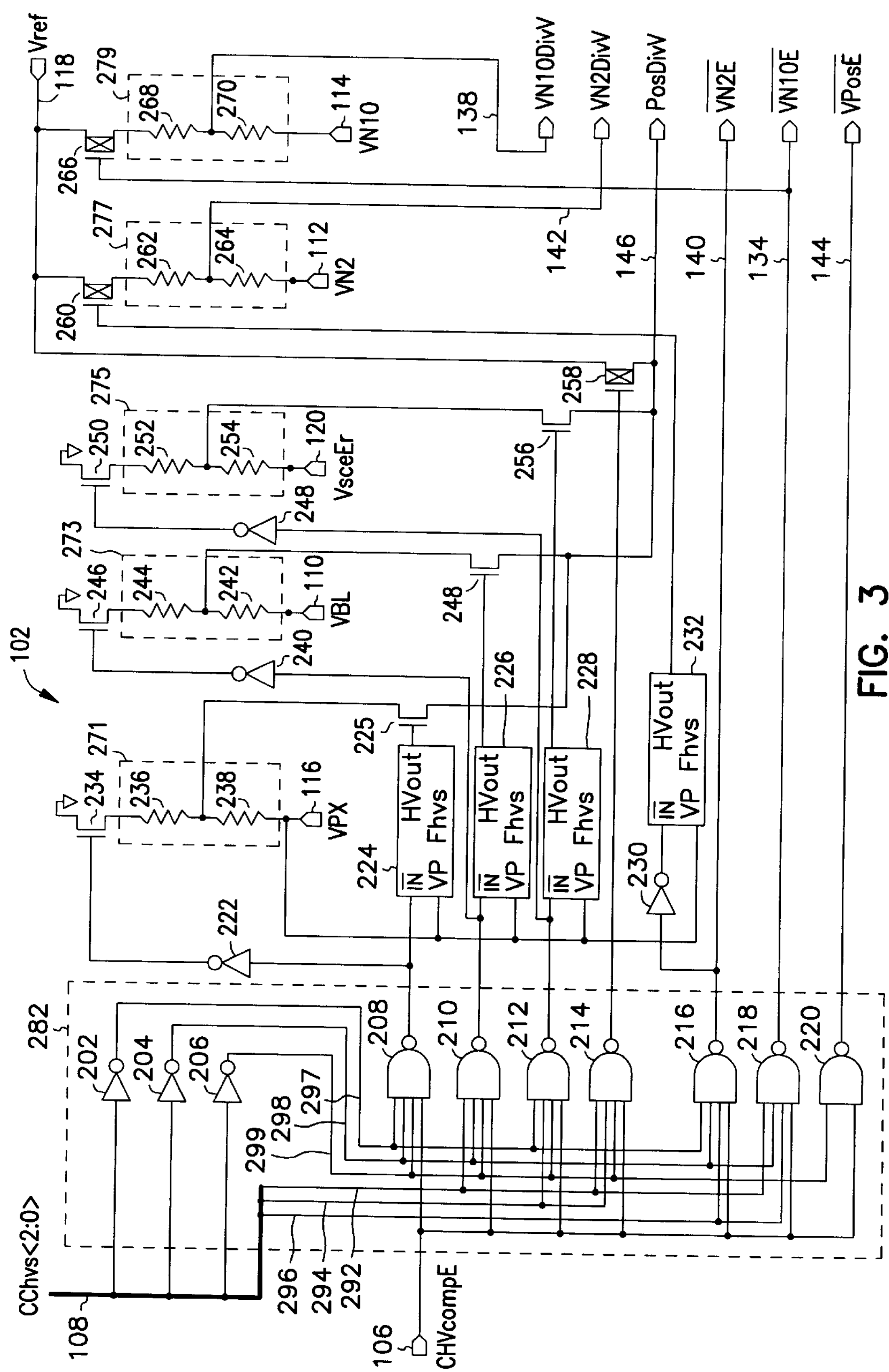
FIG. 3 is a schematic diagram of a high voltage switch employed in the switchable comparator of FIG. 2.

High voltage switch 102 is illustrated in greater detail in schematic and block diagram form in FIG. 3. High voltage switch 102 includes a decoder 282 to manipulate the high voltage switch 102 based upon information content of the CChvs signal 108 and the CHVcompE signal 106. In the embodiment illustrated in FIG. 3, decoder 282 includes three inverters 202, 204, and 206. Each inverter 202, 204, and 206 is coupled to a separate bit 292, 294, and 296 of the CChvs signal 108. The output of each inverter 202, 204, and 206, respectively, provides an inverted bit 297, 298, and 299. Each bit 292, 294, and 296, or a corresponding inverted bit 297, 298, and 299, and the CHVcompE signal 106 are coupled to each of six NAND gates 208, 210, 212, 214, 216, and 218. A seventh NAND gate 220 is coupled to the third inverted bit 299 and the CHVcompE signal 106. The outputs of three NAND gates 208, 210, and 212 are respectively coupled to the inputs of three high voltage switching circuits 224, 226, and 228. Internal signal VPX 116 is also coupled to each high voltage switching circuit 224, 226, and 228. The output of each high voltage switching circuit 224, 226, and 228 is respectively coupled to three n-channel transistors 225, 248, and 256.

The output of NAND gate 216 is coupled to the input of another high voltage switching circuit 232 through an inverter 230. High voltage switching circuit 232 is also coupled to internal signal VPX 116. The output of high voltage switching circuit 232 is coupled to an n-channel transistor 260.

The outputs of three NAND gates 208, 210, and 212 are also respectively coupled through inverters 222, 240, and 248 to three n-channel transistor 234, 246, 250. The outputs of two NAND gates 214 and 218 are respectively coupled to two p-channel transistors 258 and 266. The outputs of three NAND gates 216, 218, and 220 respectively provide the comparator enable voltages VN2E 140, VN10E 134, and VPosE 144. Internal signal Vref 118 is coupled to three p-channel transistors 258, 260, and 266.

Five transistors 234, 246, 250, 260, and 266 are each respectively coupled to five voltage dividers 271, 273, 275, 277, and 279. As illustrated in FIG. 3, the voltage dividers 271, 273, 275, 277, and 279 are respectively formed from pairs of resistors (236 and 238), (242 and 244), (252 and 254), (262 and 264), and (268 and 270). Four voltage dividers 271, 273, 275, and 277 are respectively coupled to internal signals VPX 116, VBL 110, VSceEr 120, and VN2 112. One voltage divider 279 is coupled to internal signal VN10 114. Three voltage dividers 271, 273, and 275 are respectively coupled to n-channel transistors 225, 248, and 256. Two voltage dividers 277 and 279 respectively provide scaled internal signals VN2DivV 142 and VN10DivV 138. Scaled internal signal PosDivV 146 is coupled from one of three voltage dividers 271, 273, or 275 or internal signal Vref 118 depending upon which one of four transistors 225, 248, 256, or 258 is turned on.

Voltage dividers 271, 273, and 275, respectively, provide scaled internal signals corresponding to internal signals VPX 116, VBL 110 and VSceEr 120. The internal signals VPX 116, VBL 110 and VSceEr 120 have potentials higher than a supply voltage, such as the Vcc! supply voltage of non-volatile memory IC 100. The corresponding scaled internal signals preferably have relatively low potentials (i.e., lower than a supply voltage) proportional to the relatively high potentials of the corresponding internal signals.

Voltage dividers 277 and 279 respectively provide, with internal signal Vref 118, scaled internal signals corresponding to internal signals VN2 112 and VN10 114. In one embodiment, internal signal Vref 118 has a fixed reference voltage greater than the IC substrate potential and independent of the Vcc voltage of the IC. This provides the advantage of generating the scaled internal signals independent of the Vcc voltage of the IC. Internal signals VN2 112 and VN10 114 have potentials lower than the ground potential. The corresponding scaled internal signals preferably have positive potentials proportional to negative potentials of corresponding internal signals.

In operation of the high voltage switch 102, when the CHVcompE signal 106 is activated high, decoder 282 typically activates a high voltage switching circuit and a transistor coupled to the high voltage switching circuit. The transistor is also coupled to a voltage divider and when the transistor is turned on, the voltage divider provides the scaled internal signal, corresponding to the selected internal signal, to comparator 104.

Figure 4:
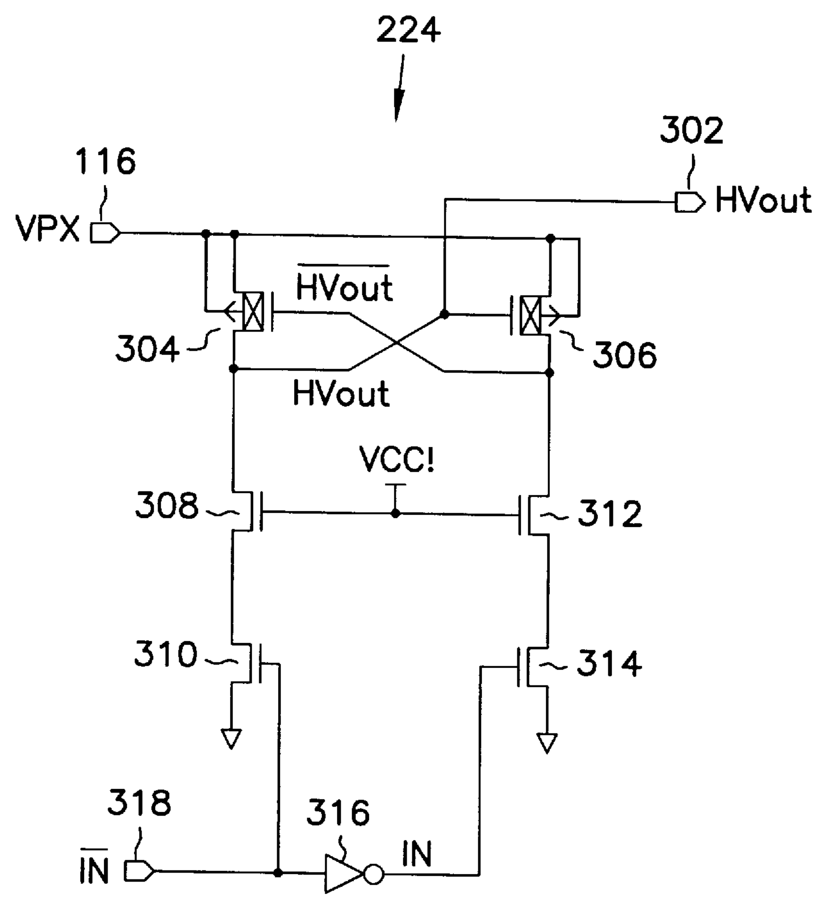
FIG. 4 is a schematic diagram of a high voltage switching circuit employed in the high voltage switch of FIG. 3.

One embodiment of high voltage switching circuit 224 is illustrated in schematic diagram form in FIG. 4. The high voltage switching circuit illustrated in FIG. 4 can also be used to implement the other three high voltage switching circuits 226, 228, and 232. In the embodiment of FIG. 4, high voltage switching circuit 224 includes two n-channel transistors 310 and 314. An input ($\overline{\text{IN}}$) 318 of high voltage switching circuit 224 is coupled to the gate of n-channel transistor 310. An inverter 316 inverts $\overline{\text{IN}}$ 318 and provides an IN signal to the gate of n-channel transistor 314. Transistor switches 310 and 314 are respectively serially coupled to pairs of serially coupled n- and p-channel transistors 304, 306, 308, and 312, as illustrated in FIG. 4. The pairs of serially coupled n- and p-channel transistors 304, 306, 308, and 312 are coupled to the internal signal VPX 116, supply voltage Vcc!, and high voltage switching circuit output signal (HVout) 302.

In operation of the high voltage switching circuit 224, a high level on the $\overline{\text{IN}}$ input signal 318 turns on n-channel transistor 310 and turns n-channel transistor 314 off to provide a ground level at the HVout signal 302. A low level on the $\overline{\text{IN}}$ input signal 318 turns off n-channel transistor 310 and turns on n-channel transistor 314, which turns on p-channel transistor 304. With p-channel transistor 304 on, p-channel transistor 304 provides the voltage of the VPX 116 internal signal to the HVout output 302. As a result, high voltage switching circuit 224 provides a high voltage (i.e, the voltage of internal signal VPX 116) at the high voltage switching circuit output HVout 302 to turn on the n-channel transistor 225 when a low signal is presented to the $\overline{\text{IN}}$ input 318 of high voltage switching circuit 224. The magnitude of the potential of the signal at the $\overline{\text{IN}}$ input 318 is relatively lower than the magnitude of the potential at the HVout output 302.

Figure 5:
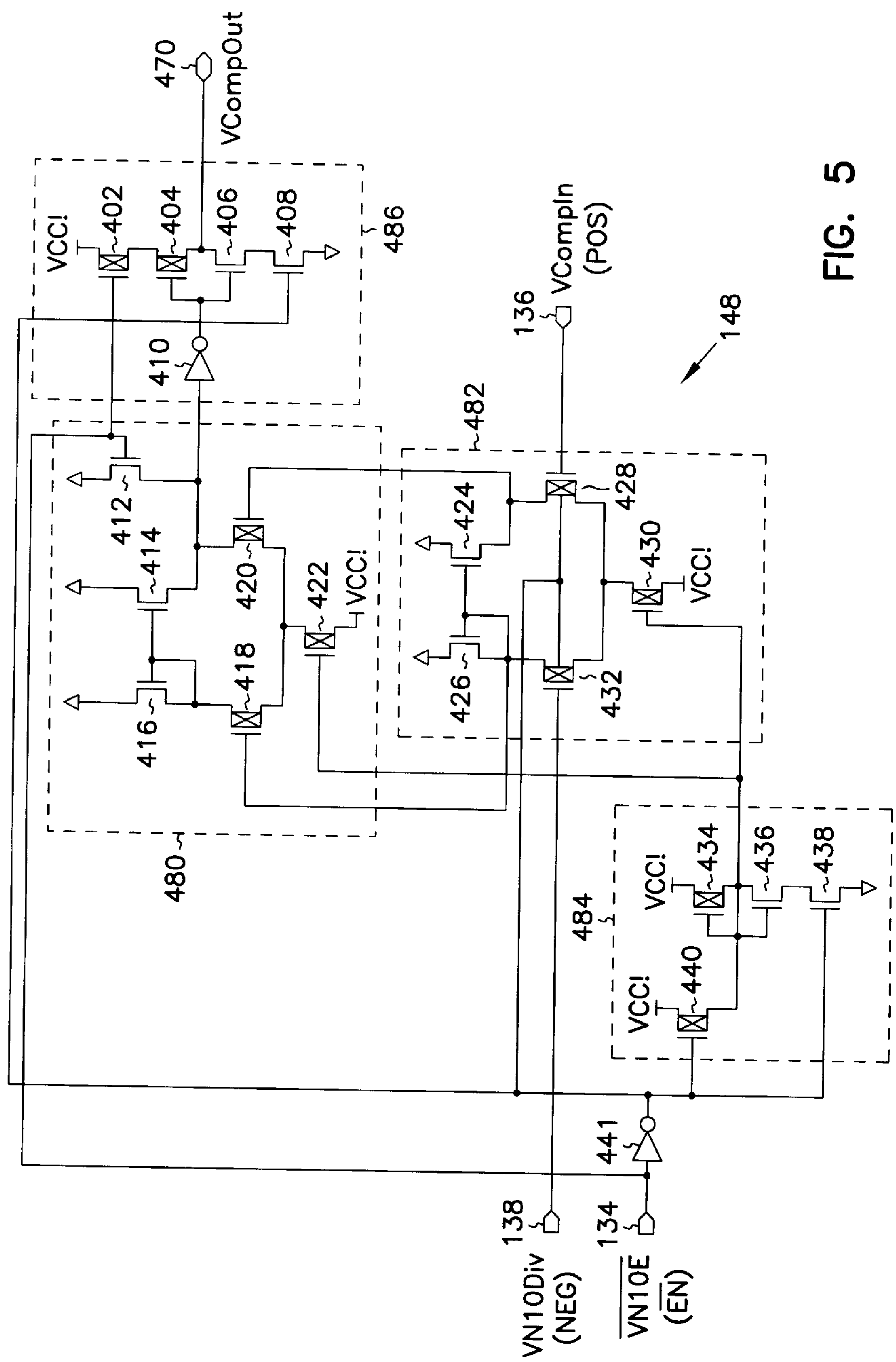
FIG. 5 is a schematic diagram of a p-type comparator employed in the switchable comparator of FIG. 2.

The comparator 104, illustrated in FIG. 2, includes two p-type comparators 148 and 150 and one n-type comparator 152. One embodiment of p-type comparator 148 is illustrated in schematic diagram form in FIG. 5. The p-type comparator circuit illustrated in FIG. 5 can also be used to implement p-type comparator 150. In the embodiment of FIG. 5, p-type comparator 148 includes a reference circuit 484 that is coupled to first and second differential amplifiers 482 and 480. The VCompin signal 136 and the scaled internal signal VN10DivV 138 are coupled to the inputs of the first differential amplifier 482. An output of the first differential amplifier 482 is coupled to an input of the second differential amplifier 480. The output of the second differential amplifier 480 is coupled to an output circuit 486. A comparator enable signal VN10E 134 is coupled to the reference circuit 484, the first and second differential amplifiers 482 and 480, and the output circuit 486. The comparator enable signal VN10E 134 is coupled through an inverter 441 to the reference circuit 484, first differential amplifier 482, and the output circuit 486.

The reference circuit 484 includes two serially coupled n-channel transistors 436 and 438 coupled to two p-channel transistors 434 and 440. The first differential amplifier 482 includes two pairs of serially coupled n- and p-channel transistors 424, 426, 428, and 432 coupled to a p-channel transistor 430. The second differential amplifier 480 includes three n-channel transistors 412, 414, and 416 coupled to three p-channel transistors 418, 420, and 422. The output circuit 486 includes two p-channel transistors 402 and 404 serially coupled to two n-channel transistors 406 and 408, and an inverter 410 coupled to two of the p- and n-channel transistors 404 and 406. The output (CompOut) 470 of the p-type comparator 148 is derived from the two p- and n-channel transistors 404 and 406, where either p-channel transistors 402 and 404 switch the VCC! supply to the VCompOut signal 470 or the n-channel transistors 406 and 408 switch the ground level to the VCompOut signal 470 depending on the comparison of the VCompin signal 136 and the scaled internal signal VN10DivV 138.

Figure 6:
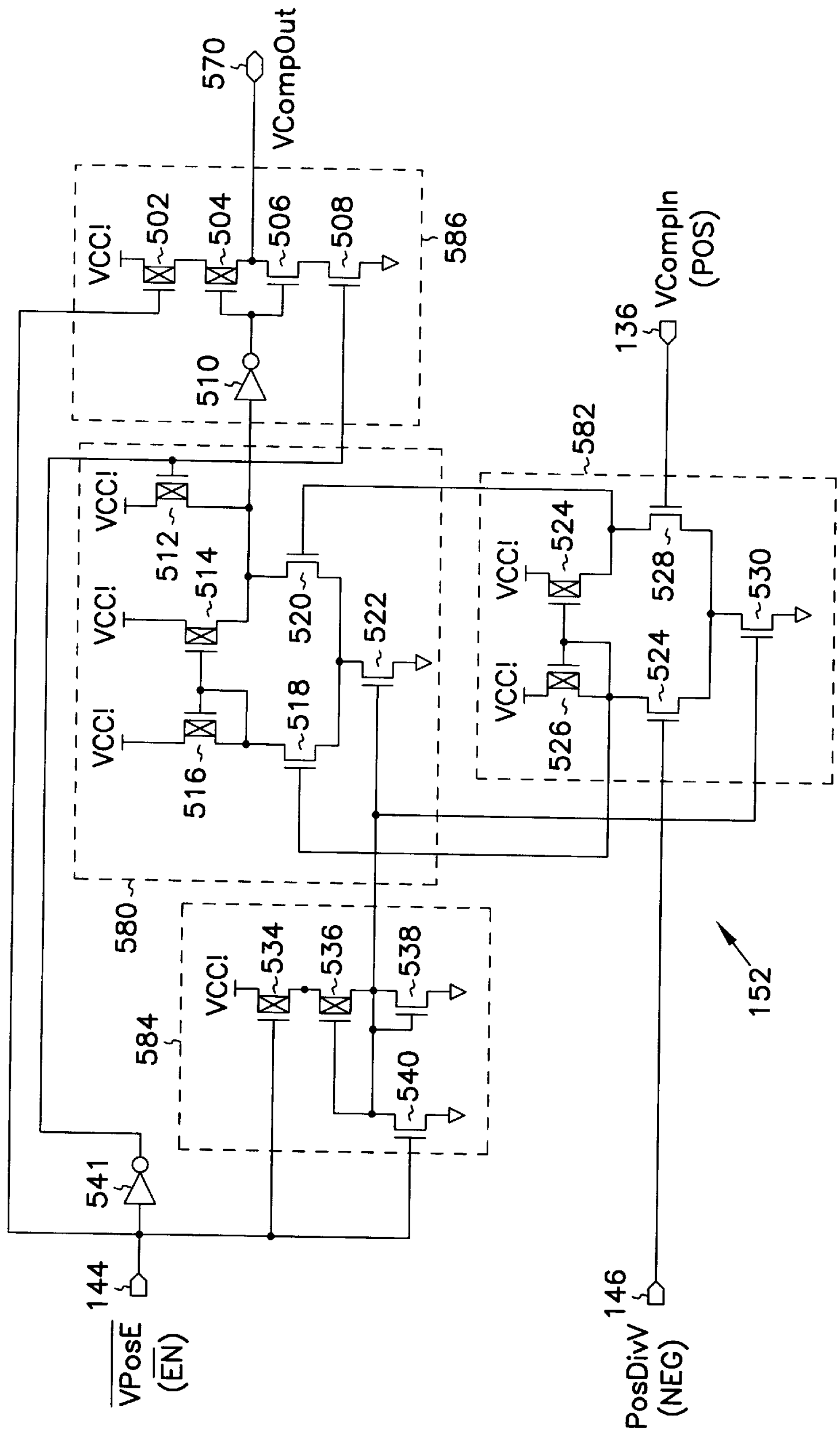
FIG. 6 is a schematic diagram of a n-type comparator employed in the switchable comparator of FIG. 2.

One embodiment of n-type comparator 152 is illustrated in schematic diagram form in FIG. 6. In the embodiment of FIG. 6, n-type comparator 152 includes a reference circuit 584 coupled to first and second differential amplifiers 582 and 580. The comparison signal 136 and scaled internal signal PosDivV 146 are coupled to the inputs of the first differential amplifier 582. An output of the first differential amplifier 582 is coupled to an input of the second differential amplifier 580. The output of the second differential amplifier 580 is coupled to an output circuit 586. A comparator enable signal VPosE 144 is coupled to reference circuit 585, the first and second differential amplifiers 582 and 580 and the output circuit 586. The comparator enable signal is coupled through an inverter 541 to the second differential 580 amplifier and the output circuit 586.

The reference circuit 584 includes two serially coupled p-channel transistors 534 and 536 coupled to two n-channel transistors 538 and 540. First differential amplifier 582 includes two pairs of serially coupled n- and p-channel transistors 524, 526, 528, and 532 coupled to a n-channel transistor 530. Second differential amplifier 580 includes three p-channel transistors 512, 514, and 516 coupled to three n-channel transistors 518, 520, and 522. Output circuit 586 includes two p-channel transistors 502 and 504 serially coupled to two n-channel transistors 506 and 508, and an inverter 510 coupled to two of the p- and n-channel transistors 504 and 506. The output (CompOut) 570 of the n-type comparator 152 is derived from the two p- and n-channel transistors 504 and 506, where either p-channel transistors 502 and 504 switch the VCC! supply to the VCompOut signal 570 or the n-channel transistors 406 and 408 switch the ground level to the VCompOut signal 570 depending on the comparison of the VCompin signal 136 and the scaled internal signal PosDivV 146.

In operation of the p- and n-type comparators 148, 150, and 152, the p- and n-type comparators 148, 150, and 152 provide a binary digital output signal (VCompOut) indicating whether a scaled internal signal, proportional to a selected internal signal, has a potential greater than or equal to the potential of the VCompin comparison signal 136. The p-type comparators 148 and 150 are used to analyze scaled internal signals corresponding to internal signals having negative potentials. The n-type comparator 152 is used to analyze scaled internal signals corresponding to internal signals having positive potentials, which are typically relatively large positive potentials.

Depending upon their potentials, the comparator enable signals VN10E 134, VN2E 140, and VPosE 144 activate one of the three comparators 148, 150, or 152 respectively, corresponding to the selected internal signal. The comparator (148, 150, or 152) is activated when the comparator enable signal activates the reference circuit. Then, the reference circuit (484 or 584) actuates the cascaded differential amplifiers (482/480 or 582/580). As result, the cascaded differential amplifiers (482/480 or 582/580) amplify the difference voltage between the scaled internal voltage and the comparison voltage of the VCompin signal 136. The output circuit (486 or 586) is a switch that is actuated by the cascaded differential amplifiers (482/480 or 582/580). The output circuit (486 or 586) provides a binary digital output signal (VCompOut 470 or VCompOut 570) indicating whether a scaled internal signal has a potential greater than or equal to the potential of the VCompin signal 136.

CONCLUSION

The present invention provides an apparatus and method for comparing at the voltage of at least one internal signals of an IC, such as non-volatile memory IC 100, with a comparison signal voltage. In one embodiment, the internal signals have negative or relatively large potentials. In one embodiment, the present invention provides a binary digital signal from the IC to indicate whether the potential of the internal signal is greater than or equal to the potential of the comparison signal. In one embodiment, the comparison signal voltage is externally provided to the IC, such by applying the comparison signal directly to an IC pad. In an alternative embodiment, the comparison signal voltage is internally generated in the IC. The present invention permits analysis of internal signals when the IC is mounted on a substrate or packaged. In addition, the present invention can be employed to modify the internal signals of the IC and/or selected components of the IC.

It is to be understood that the above description is intended to be illustrative, and not restrictive. Many other embodiments will be apparent to those of skill in the art upon reviewing the above description. The present invention may be used in many types of integrated circuits, other than non-volatile memories, including dynamic random access memories, microprocessors, and analog integrated circuits. Also, n-channel transistors may be used in place of p-channel transistors, and vice versa. Additionally, bipolar transistors, or other equivalent devices, may be used in place of field effect transistors. Hence, the scope of the invention should, therefore, be determined with reference to the appended claims along with the full scope of equivalents to which such claims are entitled.

We claim:

1. A method of testing a voltage of an internal signal in an integrated circuit, comprising:

providing a comparison signal having a voltage that is lower than the voltage of the internal signal;

scaling the voltage of the internal signal so that the voltage of the scaled internal signal is lower than the voltage of the internal signal; and comparing the voltages of the scaled internal signal and the comparison signal.

2. The method of claim 1, wherein providing a comparison signal further comprises providing a comparison signal having a voltage between zero volts and a supply voltage of the IC.

3. The method of claim 1, wherein providing a comparison signal further includes the step of selecting the internal signal from one of many internal signals.

4. The method of claim 1, further comprising providing a binary digital signal representing the results of the comparison step.

5. The method of claim 4, further comprising adjusting the voltage of the internal signal so that the voltage of the internal signal is substantially equivalent to the voltage of the comparison signal based upon the state of the binary digital signal.

6. The method of claim 4, further comprising mounting the integrated circuit on a substrate prior to the step of providing the binary digital signal.

7. The method of claim 1, wherein providing the comparison signal comprises the step of providing the comparison signal from a source within the integrated circuit.

8. The method of claim 1, wherein providing the comparison signal comprises the step of providing the comparison signal external to the integrated circuit.

9. A method of testing a voltage of an internal signal in an integrated circuit, comprising:

providing the internal signal having a voltage lower than a ground potential;

providing a comparison signal having a voltage higher than the ground potential;

converting the voltage of the internal signal to a voltage higher than the ground potential; and comparing the voltages of the converted internal signal and the comparison signal.

10. The method of claim 9, wherein providing the comparison signal further comprises providing a comparison signal having a voltage between zero volts and a supply voltage of the IC.

11. The method of claim 9, wherein providing the internal signal further includes the step of selecting the internal signal from one of many internal signals.

12. The method of claim 9, further comprising providing a binary digital signal representing the results of the comparison step.

13. The method of claim 12, further comprising adjusting the voltage of the internal signal so that the voltage of the internal signal is substantially equivalent to the voltage of the comparison signal based upon the state of the binary digital signal.

14. The method of claim 12, further comprising mounting the integrated circuit on a substrate prior to the step of providing the binary digital signal.

15. The method of claim 9, wherein providing the comparison signal comprises the step of providing the comparison signal from within the integrated circuit.

16. The method of claim 9, wherein providing the comparison signal comprises the step of providing the comparison signal external to the integrated circuit.

17. An integrated circuit, comprising:

a switch operatively coupled to internal signals and a selection signal wherein the switch selects and scales one of the internal signals corresponding to the selection signal; and a comparator coupled to the switch and a comparison signal, wherein the comparator provides a binary digital signal indicating the relative potentials of the selected internal signal and the comparison signal.

18. The integrated circuit of claim 17, further comprising:

an enable signal;

an inverter coupled to the enable signal; and a second switch coupled to the inverter and an output of the comparator.

19. The integrated circuit of claim 18, further comprising a buffer coupled to the comparator.

20. The integrated circuit of claim 17, wherein the switch comprises a decoder, a high voltage switching circuit coupled to the decoder, and a voltage divider coupled to the high voltage switching circuit.

21. The integrated circuit of claim 20, wherein the voltage divider scales an internal signal having a negative potential to a scaled internal signal having a positive potential.

22. The integrated circuit of claim 20, wherein the voltage divider scales an internal signal having a positive potential to a scaled internal signal having a positive potential lower than the potential of the internal signal.

23. The integrated circuit of claim 17, wherein the switch comprises a voltage divider, and wherein the voltage divider scales an internal signal having a negative potential to a scaled internal signal having a positive potential.

24. The integrated circuit of claim 23, wherein the voltage divider receives a fixed reference voltage and scales the internal signal based on the fixed reference voltage.

25. The integrated circuit of claim 24, wherein the fixed reference voltage is independent of a Vcc power supply in the integrated circuit.

26. The integrated circuit of claim 24, wherein the fixed reference voltage is greater than a substrate potential of the integrated circuit.

27. The integrated circuit of claim 17, wherein the comparator comprises a p-type comparator to provide a binary digital signal indicating the relative potentials of the selected internal signal having a negative potential and the comparison signal.

28. The integrated circuit of claim 17, wherein the comparator comprises a n-type comparator to provide a binary digital signal indicating the relative potentials of the selected internal signal having a positive potential and the comparison signal.

29. A memory, comprising:

a memory array;

an I/O circuit;

a control logic circuit;

an address logic circuit; and a switchable comparator, coupled to the memory array, and including:

a switch operatively coupled to internal signals and a selection signal wherein the switch selects and scales one of the internal signals corresponding to the selection signal, and a comparator coupled to the switch and a comparison signal, wherein the comparator provides a binary digital signal indicating the relative potentials of the selected internal signal and the comparison signal.

30. The memory of claim 29, further comprising:

an enable signal;

an inverter coupled to the enable signal; and a second switch coupled to the inverter and an output of the comparator.

31. The memory of claim 29, further comprising a buffer coupled to the comparator.

32. The memory of claim 29, wherein the switch comprises a decoder, a high voltage switching circuit coupled to the decoder, and a voltage divider coupled to the high voltage switching circuit.

33. The memory of claim 32, wherein the voltage divider scales an internal signal having a negative potential to a scaled internal signal having a potential higher than ground.

34. The memory of claim 32, wherein the voltage divider scales the internal signal having a positive potential to a scaled internal signal having a positive potential lower than the potential of the internal signal.

35. The memory of claim 29, wherein the comparator comprises a p-type comparator to provide a binary digital signal indicating the relative potentials of the selected internal signal having a negative potential and the comparison signal.

36. The memory of claim 29, wherein the comparator comprises a n-type comparator to provide a binary digital signal indicating the relative potentials of the selected internal signal having a positive potential and the comparison signal.

37. The memory of claim 29, wherein the memory further comprises:

an output pin; and a multiplexer circuit receiving the binary digital signal and at least one other internal signal of the memory and coupling the binary digital signal to the output pin at a first time and coupling the at least one other internal signal to the output pin at a second time.

* * * * *

UNITED STATES PATENT AND TRADEMARK OFFICE
CERTIFICATE OF CORRECTION

PATENT NO.: 5,886,935

DATED: Mar. 23, 1999

INVENTOR(S) : Lakhani et al

It is certified that error appears in the above-identified patent and that said Letters Patent is hereby corrected as shown below:

On the title page, item [73],

In address of Assignee delete "Santa Clara, Calif" and insert--Boise, Idaho-- therefore.

Signed and Sealed this

Twenty-eighth Day of March, 2000

*Attest:*

Q. TODD DICKINSON

*Attesting Officer*

*Commissioner of Patents and Trademarks*